PRODUCTION OF SEMICONDUCTOR DEVICES HAVING IMPROVED FIELD DISTRIBUTION CHARACTERISTICS

Filed Nov. 1, 1965 2 Sheets-Sheet 1

Inventor:
Reinhold Kaiser
By: Spencer & Kaye
Attorneys

Feb. 17, 1970 R. KAISER 3,496,426

PRODUCTION OF SEMICONDUCTOR DEVICES HAVING IMPROVED FIELD DISTRIBUTION CHARACTERISTICS

Filed Nov. 1, 1965 2 Sheets-Sheet 2

Inventor:
Reinhold Kaiser
By: Spencer & Kaye
Attorneys

United States Patent Office 3,496,426

Patented Feb. 17, 1970

3,496,426

PRODUCTION OF SEMICONDUCTOR DEVICES HAVING IMPROVED FIELD DISTRIBUTION CHARACTERISTICS

Reinhold Kaiser, Heilbronn, Germany, assignor to Telefunken A.G. Patentverwertungsgesellschaft m.b.H.

Filed Nov. 1, 1965, Ser. No. 505,834
Claims priority, application, Germany, Nov. 6, 1964, T 27,376
Int. Cl. H01l 3/00, 5/00
U.S. Cl. 317—234 1 Claim

ABSTRACT OF THE DISCLOSURE

A semiconductor device composed of a semiconductor body having a diffusion zone in one side thereof which defines a pn-junction whose edges extend to the surface of the body, the device having an improved voltage breakdown characteristic and being produced by providing on the one surface of the body a diffusion mask surrounding a diffusion window, and by diffusing diffusion material into the semiconductor body through the window and partly through the border region of the mask which surrounds the window so as to give the portion of the diffusion zone adjacent the edges of the resulting pn-junction an impurity gradient which is shallower in a direction parallel to the surface of the body than in a direction perpendicular thereto.

The present invention relates to a semiconductor arrangement and particularly to a transistor or diode wherein a diffusion zone of one conductivity type is formed in one of the surfaces of a semiconductor body of the opposite conductivity type.

It is known that during the production of planar transistors or diodes, the impurity material diffuses through the diffusion aperture not only at right angles to the semiconductor surface, but also in a direction parallel to this surface and thus laterally beneath the edges of the diffusion mask. As a result, the diffusion zone is formed with an impurity density gradient both in a direction perpendicular to the surface of the semiconductor body and in a direction parallel thereto, the latter gradient existing in regions below the edges of the diffusion mask. The resulting device has the disadvantage that a low breakdown voltage exists across the diffused pn-junction in the region where this junction extends toward and contacts, the surface of the semiconductor body, this being the region of high impurity density gradient.

It is a primary object of the present invention to eliminate this drawback.

It is a more specific object of the present invention to increase the breakdown voltage across a diffused pn-junction.

Another object of the present invention is to reduce the lateral impurity gradient at the edges of a diffusion zone.

Yet another object of the present invention is to increase the lateral diffusion depth at the edges of a diffusion zone.

Accordingly, the present invention provides a semiconductor device composed of a semiconductor body of a first conductivity type having a diffusion zone of the opposite conductivity type in one side thereof which defines a pn-junction consisting of a central portion extending substantially parallel to the surface of the body and an edge portion contiguous with, and surrounding, the central portion and extending to the surface of the body, wherein the entire edge portion of the pn-junction extends obliquely from the central portion up to the surface of the body. In the device of the present invention, the diffusion zone region adjacent the pn-junction edges constitutes the border of the zone and is diffused to a greater maximum extent in a direction parallel to the semiconductor body surface than in a direction perpendicular thereto.

The present invention also contemplates a process for producing the above-described device utilizing a diffusion mask having a border region, surrounding the diffusion window, which has a permeability to the diffusion material which increases in a direction toward the edge of the window. In accordance with a preferred embodiment of this diffusion mask, it is made of a diffusion-inhibiting material and the thickness of its border region decreases progressively toward the edge of the window.

Additional objects and advantages of the present invention will become apparent upon consideration of the following description when taken in conjunction with the accompanying drawings in which.

Figure 1:
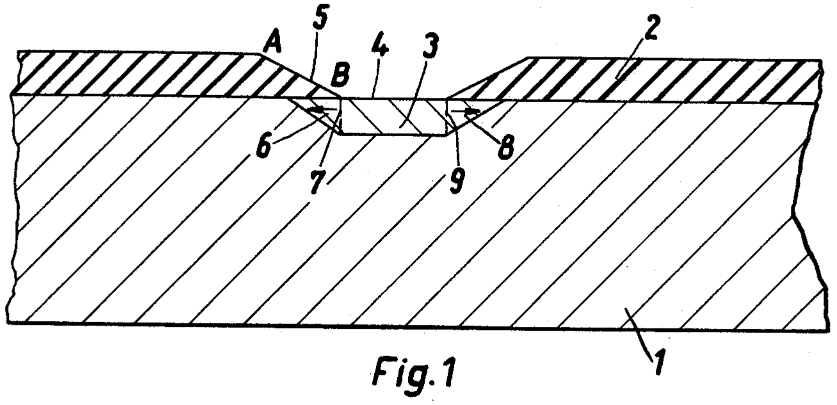
FIGURE 1 is a partial cross-sectional view of one embodiment of the present invention.

Referring first to FIGURE 1, there is shown a planar diode produced according to the present invention. This diode comprises a semiconductor body 1 on whose surface a diffusion mask 2 is provided in the form of an oxide layer. A window 4 is etched in the oxide layer and a diffusion process is carried out through this window to produce a diffused semiconductor zone 3 whose conductivity type is opposite to that of the semiconductor body 1.

In accordance with a principal feature of the present invention, the diffusion mask 2 has a tapered border region defined by the sloping wall 5 surrounding the window 4 in place of the vertical wall which normally defines such a window. Such a shaping of the mask 2 causes the border region around window 4 to be somewhat permeable to diffusion material in the region between locations A and B. The value of this permeability varies over the border region as a function of the variation in thickness, the permeability increasing in a direction from the point A to the point B, where it reaches its maximum value.

This configuration of the mask 2 permits a diffusion impurity gradient zone, to be obtained in the regions 6 and 8, defined by lines 7 and 9, respectively, of the zone 3 which has a smaller impurity density gradient in the direction of the arrows than in a direction perpendicular to these arrows. In other words, the linear rate of decrease of the impurity concentration is, in the regions 6 and 8 limited by the dashed lines 7 and 9, respectively, smaller in a direction parallel to the semiconductor surface than in a direction perpendicular thereto.

Because of the progressively varying thickness of the border region of oxide layer 2, the pn-junction produced in the semiconductor body has edge portions which extend obliquely toward the surface of the semiconductor body, while the edges of diffused pn-junctions produced according to the prior art generally extend substantially at right angles to the surface of the semiconductor body.

Figure 2:
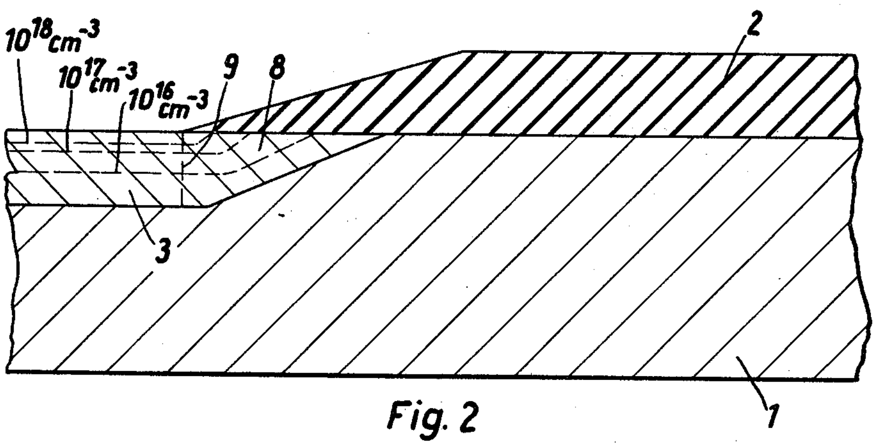
FIGURE 2 is a detail view of a portion of the embodiment of FIGURE 1.

The impurity concentration gradient obtained in the diffusion zone 3 is indicated in FIGURE 2. This figure shows a family of broken lines, each of which represents a line of constant impurity density in atoms per $cm.^3$. It has been discovered that in order to achieve a substantial improvement in the electrical properties of the semiconductor device produced according to the present invention, the lateral distance of the pn-junction from the edge of the diffusion aperture, e.g., the lateral distance from line 9, should be at least 10% greater than that existing for a pn-junction produced using a diffusion mask whose window is defined by a vertical wall. Any suitable, known impurity material may be used for the production of zone 3.

Figure 3:
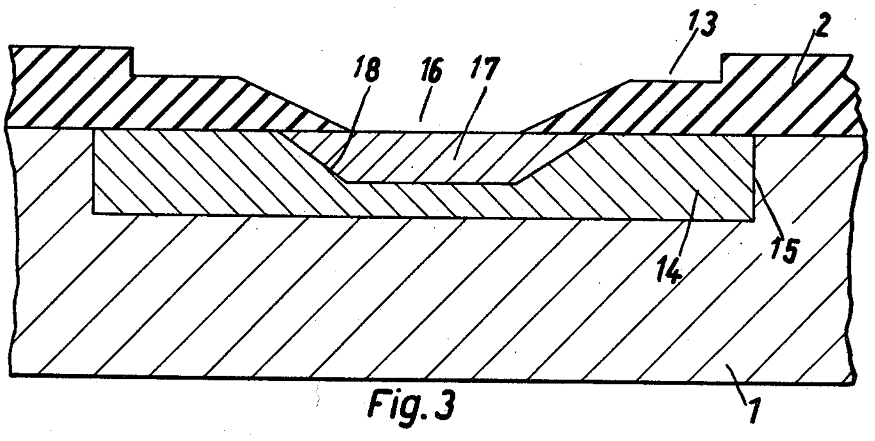
FIGURE 3 is a partial cross-sectional view of another device produced according to the present invention.

The process of the present invention can also be applied to the production of a planar transistor, as is indicated in FIGURE 3. As is shown in this figure, a $SiO_2$ layer 2 is formed on the surface of a silicon semiconductor body 1 having the conductivity type of the collector zone of the transistor to be produced. A suitably shaped diffusion aperture 13 is then etched, or otherwise formed, down to a predetermined depth in layer 2 for the diffusion of the base zone 14 into body 1. The aperture 13 is formed in a conventional manner with vertical walls so that the base-collector pn-junction 15 has a shape similar to that found in prior art devices, with edge portions which extend substantially at right angles to the surface of body 1. Then, the emitter diffusion window 16 is formed, in a manner similar to that of window 4 of FIGURE 1, with sloping walls so that the diffusion of emitter zone 17 into base zone 14 creates an emitter-base pn-junction 18 whose shape is similar to that of the pn-junction shown in FIGURES 1 and 2. Consequently, the variation of the impurity concentration in the emitter zone 17 is similar to that in the diffusion zone 3 of FIGURES 1 and 2.

Figure 4:
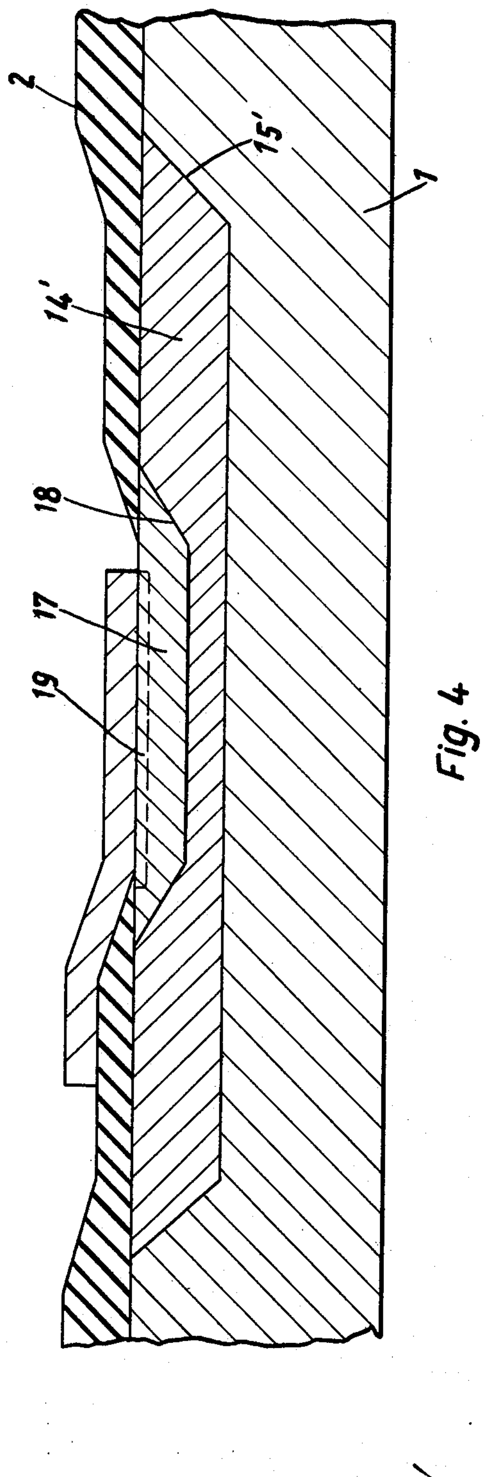
FIGURE 4 is a partial cross-sectional view showing a modified form of the device of FIGURE 3 produced according to the present invention.

Turning now to FIGURE 4, there is shown a modification of the arrangement of FIGURE 3 wherein both the base-collector junction 15′ and the emitter-base junction 18 are formed, in the manner described in connection with the junction shown in FIGURES 1 and 2, to have edge portions which extend obliquely to the surface of body 1. This result is achieved by forming both the base diffusion aperture and the emitter diffusion window to have sloping walls. When the various diffusion processes have been completed, contact can be made to the emitter region 17 by alloying conducting material 19 directly into the surface of emitter 17. The oxide layer 2 may be retained on the semiconductor to serve as a support for the contact strip and also to prevent this strip from coming in contact with either of the other two transistor regions. It may be noted from an examination of FIGURES 3 and 4 that the sloping configuration of junction 18 assures the conducting material 19 can not possibly come into contact with the pn-junction 18, and hence can not short-circuit this junction.

It may thus be seen that the novel procedure of the present invention leads to the production of pn-junctions having increased breakdown voltages. In addition, the present invention provides for an arrangement whereby the diffusion aperture, at least for the last diffused zone, can also serve as the opening through which contact is made to this zone. In this latter case, the gradual slope of the edges of the pn-junction causes the portion of the junction which is adjacent the surface of the semiconductor body to be more remote from the contact region than was the case in the prior art devices. As a result, the danger of short-circuiting the pn-junction when alloying the contacting material to the semiconductor zone is eliminated.

It may also be seen that the desired impurity distribution of the present invention is preferably obtained, during the production of the diffusion zone, with the aid of a diffusion mask which is formed in such a manner that the border region of the diffusion window or aperture offers a variable permeability to the diffusion material, which permeability increases in a direction toward the diffusion aperture. If the increase in permeability were to be in the opposite direction, the resulting lateral impurity gradient would extend in the opposite direction parallel to the surface of the semiconductor body. In the case where the diffusion mask is made of a layer of silicon dioxide, or similar material, the desired varying permeability is achieved by progressively varying the thickness of the layer in this border region. Generally, this thickness variation is obtained by tapering the layer in the vicinity of the aperture so as to cause its thickness to decrease progressively toward the edges of the aperture.

It will be understood that the above description of the present invention is susceptible to various modifications, changes, and adaptations, and the same are intended to be comprehended within the meaning and range of equivalents of the appended claim.

What is claimed is:

1. A semiconductor device comprising a semiconductor body of a first conductivity type having a diffusion zone of the opposite conductivity type in one side thereof which defines a pn-junction consisting of a central portion extending substantially parallel to the surface of said body and an edge portion contiguous with, and surrounding, said central portion and extending to the surface of said body, wherein the entire edge portion of the pn-junction extends obliquely from said central portion up to the surface of said body and is defined by a diffusion zone portion having a greater extent in a direction parallel to the semiconductor body surface than in a direction perpendicular thereto.

References Cited

UNITED STATES PATENTS

| | | | |
|---|---|---|---|
| 3,226,613 | 12/1965 | Haenichen | 317—234 |
| 3,341,378 | 9/1967 | Gerlach et al. | 148—187 |
| 3,398,029 | 8/1968 | Yasufuku et al. | 431—152 |

JERRY D. CRAIG, Primary Examiner

U.S. Cl. X.R.

148—187; 317—235